United States Patent

Noorlag et al.

[11] Patent Number: 5,990,520
[45] Date of Patent: Nov. 23, 1999

[54] METHOD FOR FABRICATING A HIGH PERFORMANCE VERTICAL BIPOLAR NPN OR PNP TRANSISTOR HAVING LOW BASE RESISTANCE IN A STANDARD CMOS PROCESS

[75] Inventors: Date Jan Willem Noorlag; Warren Robert Anderson, both of Marlboro, Mass.

[73] Assignee: Digital Equipment Corporation, Houston, Tex.

[21] Appl. No.: 08/795,159

[22] Filed: Feb. 7, 1997

[51] Int. Cl.$^6$ .................................................. H01L 29/06
[52] U.S. Cl. .......................................... 257/362; 257/361
[58] Field of Search ................................... 257/362, 361, 257/900

[56] References Cited

U.S. PATENT DOCUMENTS

| | | | |
|---|---|---|---|
| 4,400,711 | 8/1983 | Avery | 357/43 |
| 5,140,401 | 8/1992 | Ker | 357/43 |
| 5,158,899 | 10/1992 | Yamagata | 257/362 |
| 5,159,518 | 10/1992 | Roy | 361/56 |
| 5,223,737 | 6/1993 | Canclini | 257/362 |
| 5,465,189 | 11/1995 | Polgreen | 361/58 |
| 5,538,907 | 7/1996 | Aronowitz | 437/34 |
| 5,539,233 | 7/1996 | Amerasekera | 257/362 |
| 5,557,130 | 9/1996 | Orchard-Webb | 257/359 |
| 5,591,661 | 1/1997 | Shiota | 437/56 |

OTHER PUBLICATIONS

ESD Protection in a Mixed Voltage Interface and Multi–Rail Disconnected Power Grid Environment in 0.50–and 0.25–$\mu$m Channel Length CMOS Technologies, Voldman, Steven H., EOS/ESD Symposium 94, Dec. 1994.

*Primary Examiner*—Mark V. Prenty
*Attorney, Agent, or Firm*—Hamilton, Brook, Smith & Reynolds, P.C.

[57] ABSTRACT

A new method of fabricating a new vertical bipolar transistor in a protection circuit is disclosed. In the disclosed system, a layer of gate electrode material is formed over a selected surface of a silicon wafer. The gate electrode material is patterned to form gates between an emitter stripe and a base contact within the bipolar transistor. In an example embodiment, the gate as well as the emitter stripe are coupled with an input source such that excess voltage is limited and excess current sunk during ESD events on the input source. A conductive channel under the gate is formed in the presence of an ESD event on the input source. The channel conductance may further be enhanced by introduction of an appropriate dopant material. Sidewall spacers may be formed adjacent to the base/emitter isolation regions. Where the bipolar transistor is a PNP transistor, a light dosage of an n-type dopant may be implanted into the base contact prior to forming the sidewall spacers. In another aspect of the invention, where the bipolar transistor is for example a PNP transistor, a light dosage of a p-type dopant is implanted into the emitter stripe prior to forming the sidewall spacers. Further where the bipolar transistor is for example a PNP transistor, a heavy dosage of a p-type dopant is implanted into the emitter subsequent to sidewall spacer formation, and a heavy dosage of an n-type dopant is implanted into the base contact subsequent to said sidewall spacer formation.

3 Claims, 7 Drawing Sheets

METHOD FOR FABRICATING A HIGH PERFORMANCE VERTICAL BIPOLAR NPN OR PNP TRANSISTOR HAVING LOW BASE RESISTANCE IN A STANDARD CMOS PROCESS

FIELD OF THE INVENTION

The invention relates generally to design and fabrication of integrated circuits and specifically to a method for fabricating a high performance vertical bipolar NPN or PNP transistor with low base resistance in a standard CMOS process.

BACKGROUND

A known problem in integrated circuit design is the need to provide protection from short high current electrical spikes caused by Electro-Static Discharge during handling. For example, such protection is needed in all Complimentary Metal-Oxide Semiconductor (CMOS) products. This protection may be provided by introduction of what is referred to as an Electro-Static Discharge (ESD) protection circuit on the input or output lines of a circuit to be protected. Example input or output lines include data, address or power lines leading into the circuit.

Specifically, for a given integrated circuit there is a critical voltage ($V_{crit}$) level. If an input to the circuit exceeds the critical voltage level, physical breakdown of the circuit may occur. Such high voltage levels may be encountered for example during handling when no power is applied to the device. In these circumstances, the voltage on the input line must be limited so as not to exceed the critical voltage, and the associated current must be dissipated.

A further requirement in Electro-Static Discharge protection circuits, is that the protection circuit not adversely affect normal operations of the circuit to be protected. Accordingly, the protection circuit must for example not draw excessive current when no voltage spike is present, and not introduce any excessive capacitance or leakage.

In existing systems, diodes have been placed on input or output (I/O) lines of circuits to protect the circuits from voltage spikes. Such diodes have for example been placed between the input source and what is referred to as a "clamp" circuit. The clamp circuit is designed such that if it is connected to the input source directly, the voltage from the input source is limited to below the critical level for the circuit to be protected, and any current associated with excessive voltage is dissipated. In this type of protection circuit, a bipolar transistor may be used as the diode device. Where a bipolar transistor is used, the voltage operational characteristics of the device become more effective as the base and emitter resistance within the bipolar transistor is reduced. Specifically, the transistor will drop a lower voltage at the same current when this resistance is lower, thus lowering the voltage further below $V_{crit}$ and accordingly providing better protection of the circuit to be protected.

In existing systems for integrated circuit fabrication, protection circuits are formed using a vertical bipolar PNP transistor having base and emitter contacts arranged in alternating stripes on the surface of the device separated by field isolation regions provided by the underlying CMOS fabrication process. For example, shallow trench (STI) or LOCOS field isolation regions are commonly used for this purpose in existing systems. In a typical existing system each emitter stripe is arranged adjacent to two base contacts.

The bipolar transistors resulting from such existing fabrication systems exhibit several disadvantages. The base resistance relevant to performance of a bipolar transistor in general is known to be the sum of the intrinsic base resistance and the extrinsic base resistance. The extrinsic base resistance is the resistance of the base region between approximately the edge of the emitter region and the edge of the base contact. The extrinsic base resistance is accordingly a function of both the distance between the emitter and the base contact, and the resistivity (or doping level) of that region in the base.

In PNP bipolar transistors of protection circuits fabricated using existing systems, the distance between the emitter and the edge of the base contact is determined by the width of the standard field isolation region for the integrated circuit. The doping for the extrinsic base region is the standard N-well doping and other standard CMOS implants of the fabrication process.

The intrinsic base resistance of the bipolar transistor is the resistance of the base beneath the emitter stripe. The intrinsic base resistance is determined primarily by the ratio of area to perimeter in the surface geometry of the emitter stripe. Bipolar transistors in protection circuits fabricated using existing systems have emitter stripe widths that are determined by the spacing between field isolation regions. Such spacing results in an undesirably large ratio of surface area to perimeter in the emitter stripe. Further, the doping of the region beneath the emitter stripe is the standard N-well doping of the fabrication process, for example the N-well doping in a standard p-substrate CMOS fabrication process. Such existing systems fail to provide a base resistance sufficiently low for many applications without using a prohibitively large surface area for the emitter stripes.

For the reasons stated above there is required a new ESD protection circuit and fabrication process. The new protection circuit should include a bipolar transistor having a lower base resistance than is provided by existing fabrication systems. The new fabrication system should provide a new bipolar transistor in a protection circuit having lower extrinsic and intrinsic base resistance while using conventional fabrication process steps. Further, the new bipolar transistor in the protection circuit should advantageously use less geographic area than in existing protection circuits to accomplish the same functionality.

SUMMARY

In accordance with principles of the invention there is disclosed a new method of fabricating a new vertical bipolar transistor in a protection circuit. In the disclosed system, a layer of gate electrode material is formed over a selected surface of a silicon wafer. The gate electrode material is patterned into gates to form base/emitter isolation regions between an emitter stripe and a base contact within the bipolar transistor. In a further aspect of the invention, sidewall spacers are formed adjacent to the gates which form the base/emitter isolation regions.

In one aspect of an example embodiment of the invention, the bipolar transistor is a PNP transistor, and a light dosage of an n-type dopant is implanted into the base contact prior to forming the sidewall spacers. In another aspect of the invention, where the bipolar transistor is for example a PNP transistor, a light dosage of a p-type dopant is implanted into the emitter stripe prior to forming the sidewall spacers.

Further disclosed, where the bipolar transistor is for example a PNP transistor, is advantageously implanting a heavy dosage of a p-type dopant into the emitter subsequent to sidewall spacer formation, and implanting a heavy dosage of an n-type dopant into the base contact subsequent to sidewall spacer formation.

In a preferred embodiment, the step of implanting a light dosage of an n-type dopant into the base contact prior to forming the sidewall spacers is simultaneous with a Lightly Doped Drain (LDD) implant for nMOS transistors formed during the fabrication process. In another preferred embodiment, the step of implanting a light dosage of a p-type dopant into the emitter prior to forming the sidewall spacers is simultaneous with a Lightly Doped Drain (LDD) implant for pMOS transistors formed during the fabrication process.

In another preferred embodiment, the step of implanting a heavy dosage of an n-type dopant into the base contact subsequent to sidewall spacer formation is simultaneous with a source/drain implant to form diffusion areas in nMOS transistors formed during the fabrication process. In another preferred embodiment, the step of implanting a heavy dosage of a p-type dopant into the emitter subsequent to sidewall spacer formation is simultaneous with a source/drain implant to form diffusion areas in pMOS transistors formed during the fabrication process.

In another preferred embodiment, an n-type dopant (for a PNP bipolar transistor) is implanted prior to or after introduction of the gate oxide. For example, during a threshold correction implant, the areas in which the emitters are to be formed is masked, and the unmasked areas implanted with the n-type dopant. This implant is for example simultaneous with a PMOS correction implant using for example phosphorous or arsenic to make the surface area beneath the gates more N+ and as a result more conductive. As a result a relatively low extrinsic base resistance may be achieved.

Throughout the disclosure, specific implementation of masking or shielding of the various regions during implantation steps is performed using conventional process steps, for example photolithography, or the use of reticles. Other deposition methods may also be employed, such as diffusion, additionally or alternatively to ion implantation consistent with the principles of the disclosed invention.

In this way there is disclosed a new ESD protection circuit and fabrication process. The disclosed protection circuit includes a bipolar transistor having a lower overall base resistance than is provided by existing fabrication systems. The new fabrication system provides lower extrinsic and intrinsic base resistance in the protection circuit while still using conventional fabrication process steps. In addition, the disclosed protection circuit advantageously uses less geographic area than existing circuits used to accomplish the same functionality.

In an example embodiment, the disclosed system includes a method for fabricating a high performance vertical bipolar NPN or PNP transistor with low base resistance in a standard CMOS process. The disclosed method allows the emitter stripe to be narrower than in existing systems and for the base contact areas to be closer to the emitter. As a result, relative to previous systems, the ratio of emitter stripe surface area to emitter stripe perimeter may be decreased for a given level of ESD protection. In the disclosed system, the emitter stripe width and base contact spacing are defined by MOS-like poly gates. Because the gate electrode material can conveniently be patterned to relatively narrow widths, the disclosed system provides for relatively narrow emitter stripe widths. In an example embodiment of the disclosed system, a relatively high dopant level may be provided to the extrinsic base, further reducing base resistance.

Further in an example embodiment, the disclosed system applies a source I/O signal to the gates forming the base/emitter isolation regions. In this way, when a high current event occurs, such as an ESD, a forward bias is provided under the gates, effectively turning the gates on during ESD conditions. A suitable dopant is for example introduced into the channel under the gates during fabrication to further increase the conductivity of the channel under the gates during ESD conditions.

BRIEF DESCRIPTION OF THE DRAWINGS

The foregoing features and other aspects of the invention will now become apparent when the accompanying description is read in conjunction with the following drawings in which.

DETAILED DESCRIPTION OF THE PREFERRED EMBODIMENTS

Figure 1:
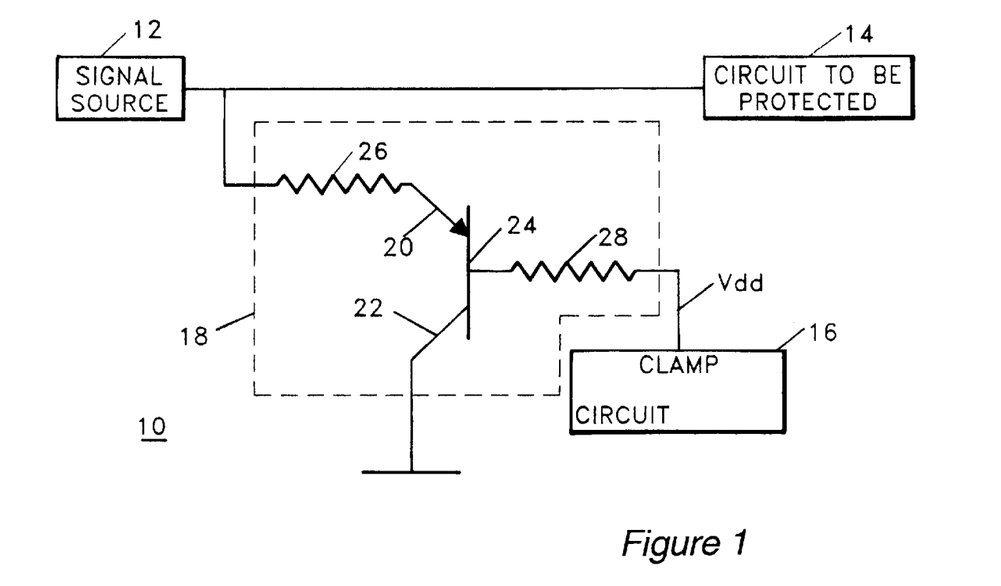
FIG. 1 is a block diagram showing an example embodiment of an ESD protection circuit.

FIG. 1 shows an example embodiment of an ESD protection circuit 10. In FIG. 1 and the subsequent figures, elements are not drawn to scale. The protection circuit 10 is shown including a signal source 12, for example a data, address, I/O, or other type of signal. The protection circuit 10 is shown connected to a circuit to be protected 14. The protection circuit 10 is further shown including a bipolar transistor 18, acting as a diode between the signal source 12 and a power supply ($V_{dd}$). The power supply contains its own clamp circuit 16 which limits its voltage rise when charged from the bipolar transistor base current. The bipolar transistor 18 is for example a vertical PNP transistor including an emitter 20, a collector 22, and a base 24. The cumulative equivalent resistance of the emitter 20 is shown for example by the resistor 26, and the cumulative equivalent resistance of the base 24 is shown for example as resistor 28. The signal source 12 is shown coupled with the emitter 20, and the base 24 is shown coupled with the power supply clamp circuit 16.

During operation of the elements shown in FIG. 1, when the voltage level from the signal source exceeds a predetermined threshold, the bipolar transistor 18 will connect the signal source 12 to the clamp circuit 16. By connecting the clamp circuit 16 to the signal source 12, voltage above a predetermined limit is dissipated and the associated current sunk to a grounded connection.

Figure 2:
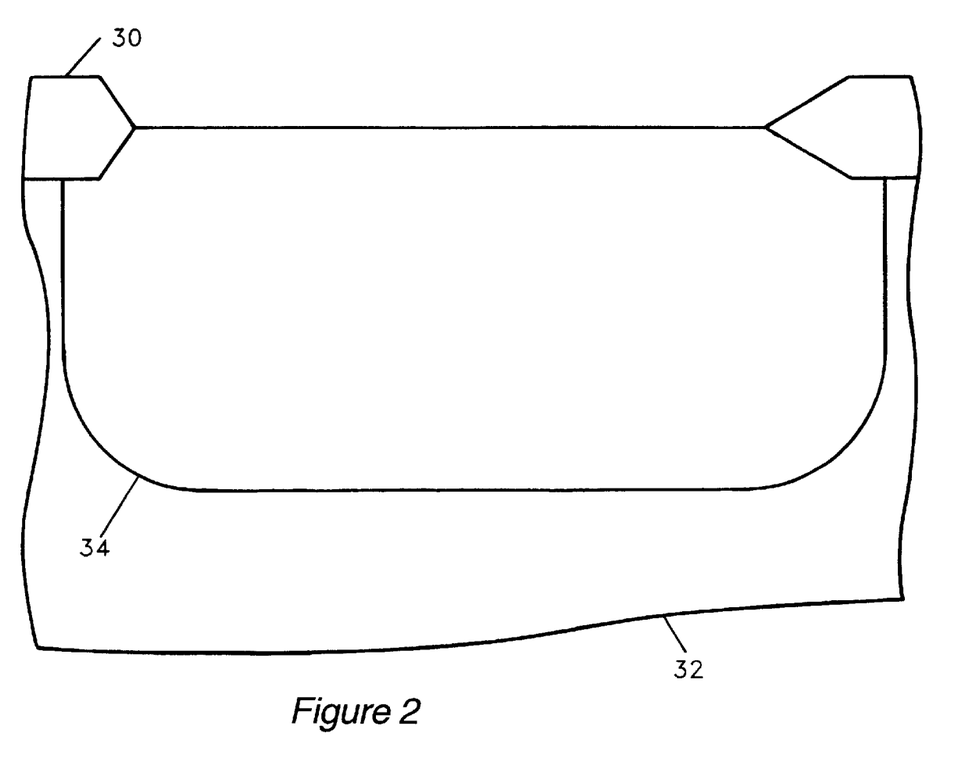
FIG. 2 is a cross sectional view of an example silicon wafer having field isolation regions and an N-well.

FIG. 2 is a cross-sectional view of an example of the silicon wafer during processing by the disclosed integrated circuit fabrication method. FIG. 2 shows a silicon wafer 32 including an n-well 34 between two field isolation regions 30. Conventional techniques may be used to form the field isolation regions 30 and n-well 34.

Figure 3:
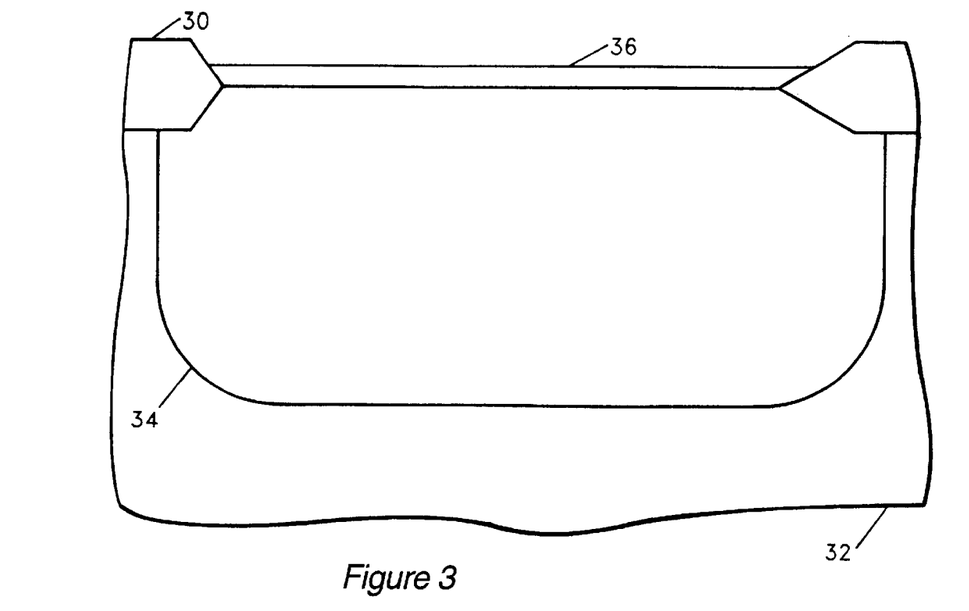
FIG. 3 is a cross sectional view of an example silicon wafer having field isolation regions, an N-well, and a gate oxide layer formed on the top surface of the N-well.

FIG. 3 shows a cross-sectional view of the silicon wafer during processing by the present fabrication method. FIG. 3 shows a silicon wafer 32 including an n-well 34 between two field isolation regions 30. FIG. 3 further shows a layer 36 of gate oxide. The step of forming the gate oxide 36 may for example be accomplished by conventional means. In the alternative, other appropriate insulator layers may be used in place of the oxide 36, for example a nitride layer.

Figure 4:
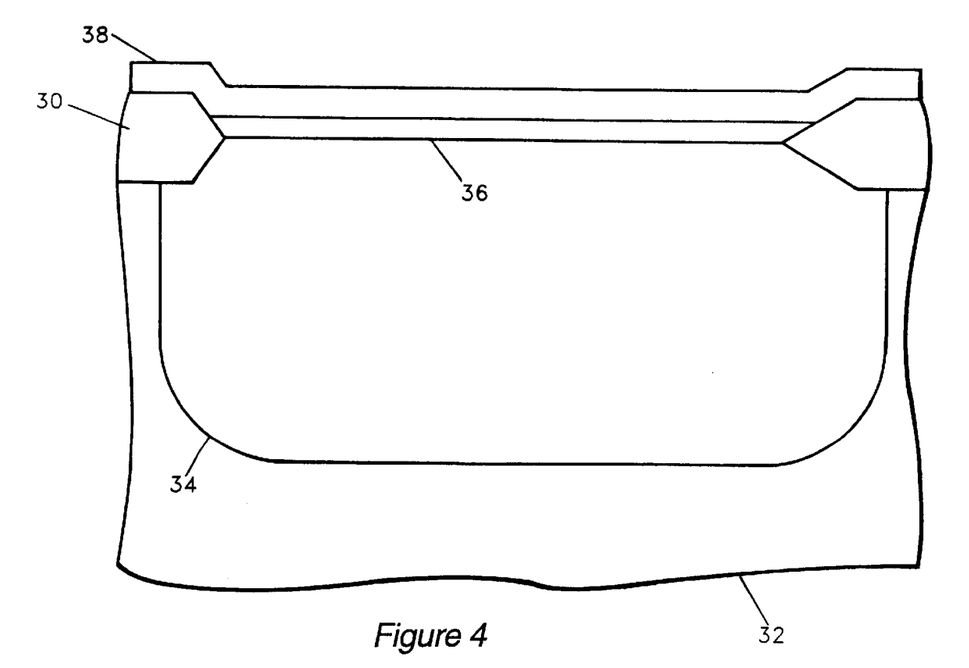
FIG. 4 is a cross sectional view of an example silicon wafer having field isolation regions, an N-well, a gate oxide formed on a top surface of the N-well, and a layer of gate-electrode material.

FIG. 4 shows a cross-sectional view of an example silicon wafer during fabrication by the disclosed method. FIG. 4 shows a silicon wafer having an n-well 34 between two field isolation regions 30, a gate oxide layer 36 above the n-well 34, and a layer of gate electrode material 38 over a top surface of the gate oxide layer 36. The layer of gate electrode material 38 is further used as the gate interconnect material for the device. The gate electrode material 38 is for example a semi-conductor material. The gate electrode material 38 is described herein for purposes of example as poly-silicon, and formed using conventional methods.

Figure 5:
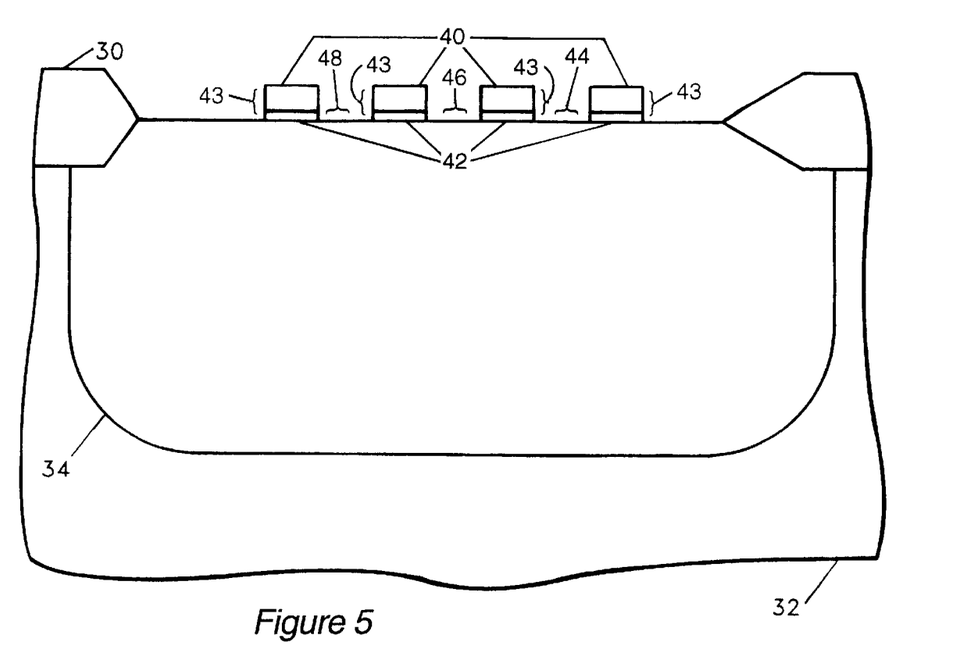
FIG. 5 is a cross sectional view of an example silicon wafer having field isolation regions, an N-well, and several gates patterned from the gate electrode material.

FIG. 5 shows a cross-sectional view of an example silicon wafer 32 during the disclosed fabrication method. FIG. 5 shows a silicon wafer 32 including an n-well 34 between field isolation regions 30, and a patterned gate electrode layer 40 over the patterned gate oxide layer 42. For example the gate electrode layer 40 and gate oxide layer 42 have been patterned using conventional means, for example by means of an etch process. The patterning of the gate electrode layer 40 and the gate oxide layer 42 as shown in FIG. 5 is performed such that a surface area 46 where an emitter stripe is to be formed in the resulting vertical bipolar transistor is exposed, as well as surfaces of a first base contact 44 and a second base contact 48. While the example embodiment of FIG. 5 is shown having two base contacts 44 and 48, one skilled in the art will recognize that the principles of the invention apply to alternative embodiments having for example one base contact. In this way the patterned gate electrode layer 40 and the patterned gate oxide layer 42 form gates 43.

Figure 6:
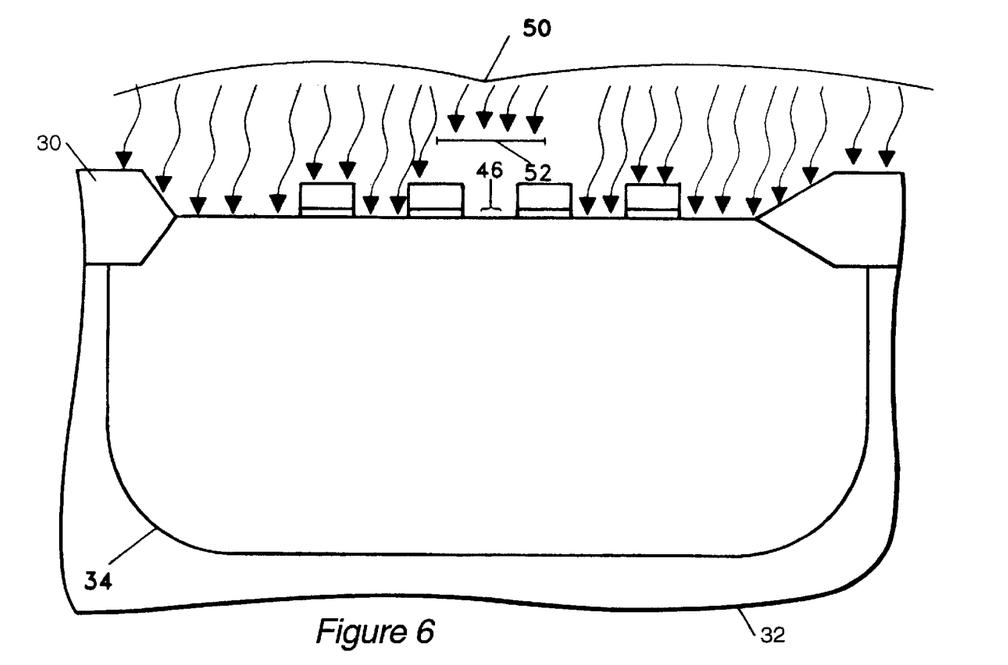
FIG. 6 is a cross sectional view of an example silicon wafer having field isolation regions, an N-well, several gates, and a dopant being applied by ion implantation to selected surfaces excluding a surface of an emitter stripe.

FIG. 6 shows a cross section of an example silicon wafer during processing by the disclosed fabrication method. The silicon wafer 32 is shown including an n-well 34 between field isolation regions 30, as well as an emitter surface area 46. In FIG. 6 an n-type dopant material 50 is being applied by, for example, ion implantation to surface areas other than that which is blocked by the shield 52. The shield 52 is shown over the emitter surface area 46.

The dopant 50 is of a dosage appropriate to provide what is referred to as a "Lightly Doped Drain" or "LDD" implant for n-type transistors in the device being fabricated. The LDD implant is used to limit the hot carrier effect in nMOS transistors formed by conventional integrated circuit fabrication methods. In conventional systems, the dopant 50 is implanted into the source/drain diffusion areas and gate electrodes of the nMOS transistors of the device, but not into any elements of any pMOS transistor. In the disclosed system, the dopant 50 is implanted into the surface areas of the elements shown in FIG. 6 except for those covered by the mask 52, which include the emitter surface area 46. For purposes of example the dosage of the dopant 50 is equal to $6 \times 10^{13}/cm^2$, and consists of an n-type dopant such as arsenic, phosphorous or antimony. Example energy levels for the implantation are between 30 and 100 keV. In an alternative example embodiment, the LDD implant shown in FIG. 6 is masked completely, such that all surfaces shown in FIG. 6 are not exposed.

Figure 7:
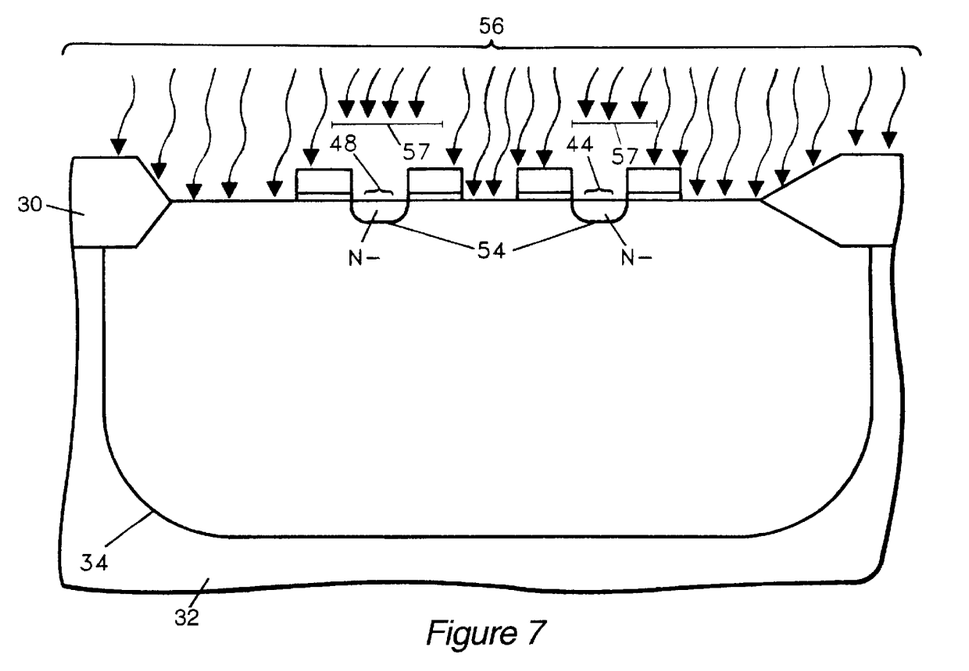
FIG. 7 is a cross sectional view of an example silicon wafer having field isolation regions, an N-well, several gates, and a dopant material being applied by ion implantation to selected surfaces excluding the base contact regions.

FIG. 7 shows a cross section of an example silicon wafer 32 during processing by the disclosed fabrication method. The silicon wafer 32 is shown including an n-well 34 between field isolation regions 30, as well as two base contacts 44 and 48. In FIG. 7 a p-type dopant material 56 is being applied, for example by ion implantation, to surface areas other than that which is shielded by the shield 57. The shield 52 is shown over the base contacts 44 and 48.

The dopant 56 in FIG. 7 is of a dosage appropriate to provide what is referred to as a "Lightly Doped Drain" or "LDD" implant for p-type transistors in the device being fabricated. The LDD implant in FIG. 7 is used to limit the hot carrier effect in pMOS transistors formed by conventional integrated circuit fabrication methods. In conventional systems, the dopant 56 is implanted into the source/drain diffusion areas and gate electrodes of the pMOS transistors of the device, but not into any elements of any nMOS transistor. In the disclosed system, the dopant 56 is implanted into the surface areas of the elements shown in FIG. 7 except for those under the mask 57. The base contacts 48 and 44 are shown under the mask 57. For purposes of example the dosage of the dopant 56 is equal to $6 \times 10^{13}/cm^2$, and consists of a p-type dopant such as boron or indium. Example energy levels for the implantation are between 30 and 100 keV. In an alternative example embodiment, a dedicated process step is used to introduce a higher dosage of a p-type dopant into the surfaces shown exposed in FIG. 7. In such an alternative embodiment, the extrinsic base resistance is further reduced.

Figure 8:
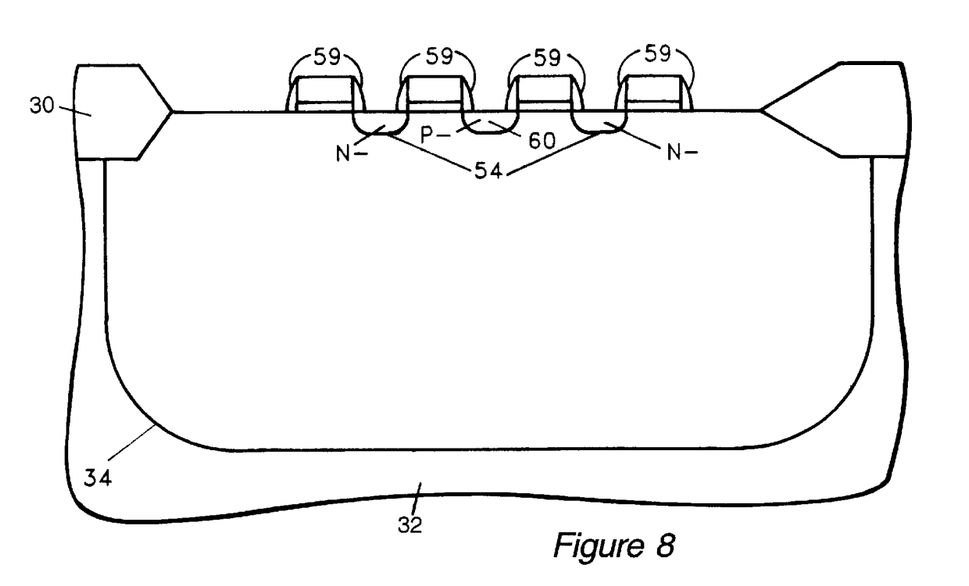
FIG. 8 is a cross sectional view of an example silicon wafer including field isolation regions, an N-well, several gates, and sidewall spacers formed on sides of the several gates.

At FIG. 8 there is shown the structure of FIG. 7 further including sidewall spacers 59, for example formed using conventional methods. For example, an anisotropic etch may be used to provide the sidewall spacers adjacent to gate electrodes in conventional methods. In a preferred embodiment of the disclosed method, the same etch step may be used to form the sidewall spacers adjacent to the gates of the bipolar transistor.

In the example of FIG. 8, the spacers 59 are for example silicon dioxide or silicon nitride. The spacers 59 have for example a width of between 500 and 2000 Angstroms. The width of the spacers 59 advantageously reduces the width of the emitter stripe.

Figure 9:
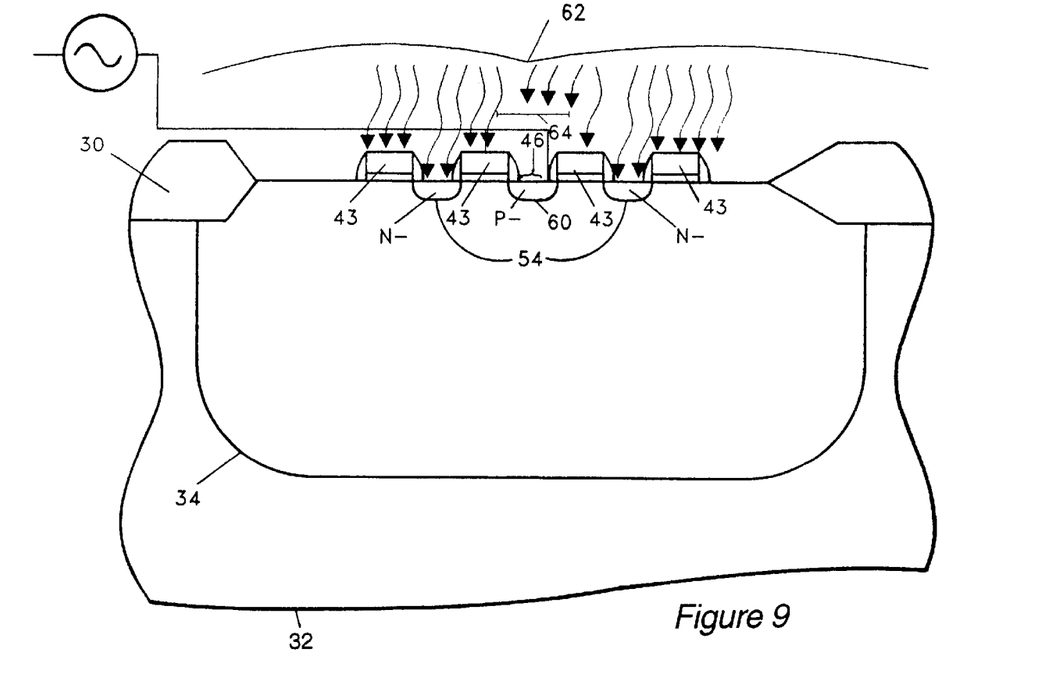
FIG. 9 is a cross sectional view of an example embodiment of a silicon wafer including field isolation regions, an N-well, patterned gate-electrode layer, sidewall spacers on the sides of the several gates, and a dopant being applied by ion implantation to selected surfaces excluding the surface of an emitter area.

FIG. 9 shows a cross section of an example embodiment of a silicon wafer including field isolation regions 30, an n-well 34, gates 43, and sidewall spacers on the sides of the gates 43. Further in FIG. 9 an n-type dopant 62, for example phosphorous, arsenic or antimony, is shown being applied for example by ion implantation to selected surfaces excluding the surface 46 of an emitter stripe 60. FIG. 9 also shows that prior to the implantation of the dopant 62 the emitter stripe 60 is lightly p-type, while the base contact regions are lightly n-type. A shield or mask 64 is shown preventing the introduction of the dopant 62 into the emitter stripe 60. In a preferred embodiment the implantation of the dopant 62 in FIG. 9 is performed simultaneously with an NMOS Source/Drain implantation which forms the diffusion areas for NMOS transistors in the device being fabricated. However, a dedicated implant of an n-type dopant, such as phosphorous, arsenic, or antimony, sufficient to form the base contacts for the bipolar transistor may be used in accordance with the present invention. Such an implant would for example have a dosage of between $10^{14}/cm^2$ and $10^{16}/cm^2$. Example energy levels for the implant range between 30 to 100 kev. FIG. 9 also shows a signal source 100, coupled to the emitter stripe 60 and the gate electrode 43, which will be discussed in further detail below.

Figure 10:
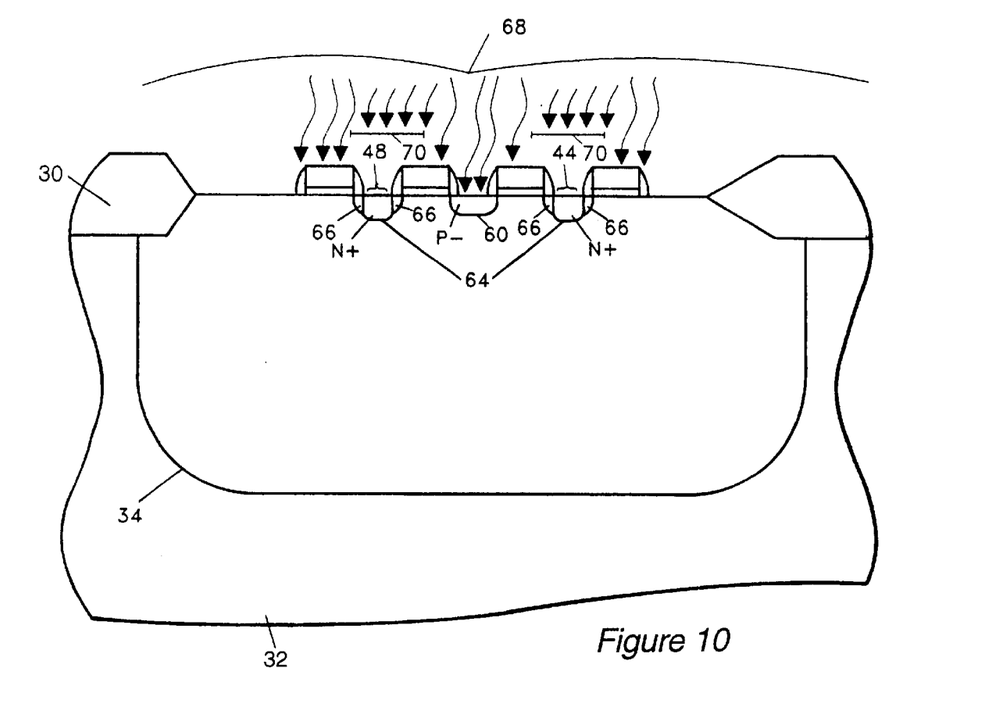
FIG. 10 is a cross sectional view of an example embodiment of a silicon wafer including field isolation regions, an N-well, several gates, sidewall spacers formed on the sides of the several gates, and a dopant material being applied by ion implantation to selected surfaces excluding the surface of base contact areas.

FIG. 10 shows a cross section of an example embodiment of a silicon wafer 32 including field isolation regions 30, an n-well 34, patterned gate-electrode and gate oxide layers, and sidewall spacers on the sides of the patterned gate-electrode and gate oxide layers. Further in FIG. 10 a p-type dopant 68 is shown being applied for example by ion implantation to selected surfaces excluding the surfaces 44 and 48 of base contacts 54 for the bipolar transistor. Thus the p-type dopant 68 is applied to the emitter stripe 60. Examples of the p-type dopant 68 include boron or indium.

FIG. 10 also shows that prior to the implantation of the dopant 68 the emitter stripe 60 is lightly p-type, while the base contact regions are heavy n-type as a result of the implantation in FIG. 10. A shield or mask 70 is shown preventing introduction of the dopant 68 into the base contacts 64. In a preferred embodiment the implantation of the dopant 68 in FIG. 10 is performed simultaneously with the PMOS Source/Drain implantation which forms the diffusion areas for PMOS transistors in the device being fabricated. However, a dedicated implant of a p-type dopant sufficient to form the base contacts for the bipolar transistor may be used in accordance with the present invention. Such a dedicated implant would for example be boron or indium having a dosage of for example between $10^{14}/cm^2$ and $10^{16}/cm^2$ at an energy of for example between 15 to 100 keV.

Figure 11:
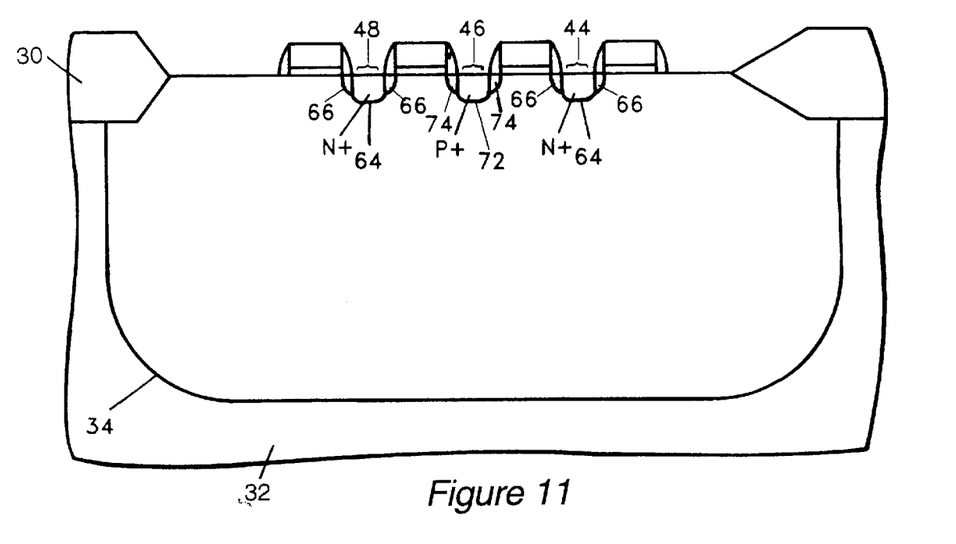
FIG. 11 is a cross sectional view of a silicon wafer having an example embodiment of an ESD protection circuit including a vertical PNP transistor in accordance with principles of the invention.

FIG. 11 shows a cross section of a silicon wafer 32 having an example embodiment of an ESD protection circuit including a vertical PNP transistor fabricated in accordance with principles of the invention. In FIG. 11 the emitter stripe 72 beneath the surface 46 is shown to be heavily p-type. The areas 74 adjacent to the emitter stripe 72, and beneath the sidewall spacers 59, are shown to be lightly p-type. Further, the base contacts 64, beneath the surfaces 48 and 44 are shown to be heavily n-type. However, the areas 66 adjacent to the base contacts 64, and beneath the sidewall spacers 59, are lightly n-type. The n-well 34 is the base of the bipolar transistor, while the area of the wafer 32 outside is shown to be the collector for the bipolar transistor, where the wafer 32 is for example a p-type substrate.

In an example embodiment, a subsequent metalization process is used to couple the gates 43 (FIG. 9) with a signal source. As a result, when an high current event occurs on the signal source, such as an ESD spike, the gates 43 are effectively turned on, creating a forward bias in the channel area beneath the gates 43. Accordingly the circuit can sink a relatively large amount of current during the high current event.

The structure of FIG. 11 provides several other advantages over existing systems. These advantages include a potential reduction in the "pitch" (equal to the sum of the line width and spacing) of the emitter stripes and base contacts. The minimum pitch of emitter stripes and base contacts in the disclosed fabrication system is the minimum. width and spacing of the polysilicon gate areas. Thus in an example embodiment where a standard CMOS process is used, the pitch of the emitter stripes and base contacts could be equal to twice the minimum feature size of the device being fabricated. This emitter stripe/base contact pitch provided by the present system is significantly smaller than that provided by existing systems.

Further, in the bipolar transistor shown in FIG. 11, the fraction of the total base resistance determined by the intrinsic base resistance, is relatively low. This is because the intrinsic base resistance is primarily determined by the width of the narrow emitter stripe provided by the present system, which is determined by the spacing between two polysilicon gates. As disclosed above, the emitter stripe width can further be reduced by formation of oxide spacers on the sides of the polysilicon isolations in the bipolar transistor. The resulting reduction of emitter stripe width is equal to twice the spacer width.

Figure 12:
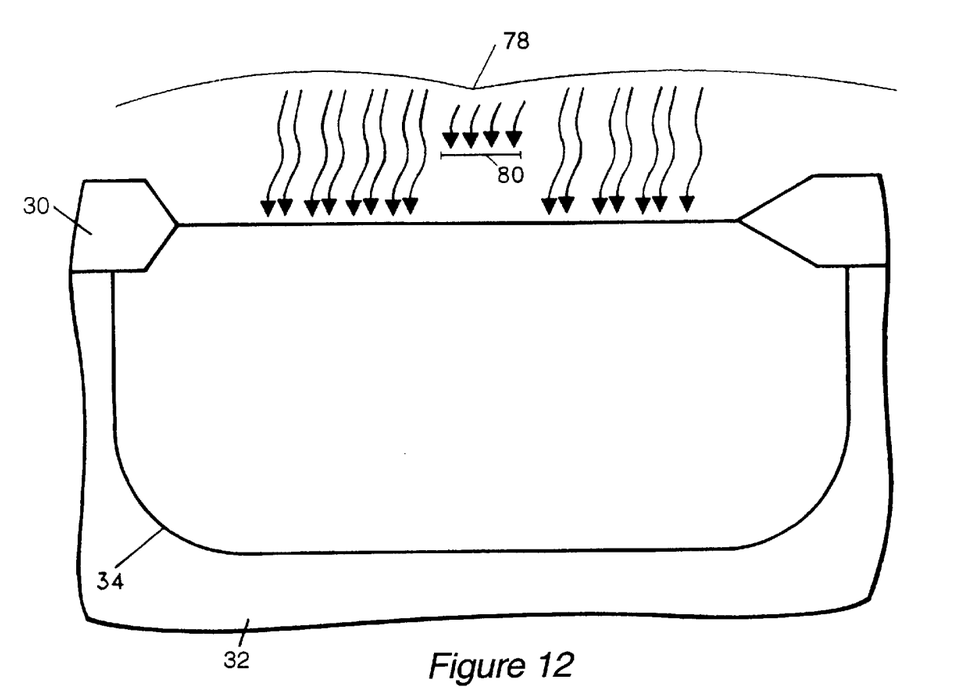
FIG. 12 is a cross sectional view of a silicon wafer having field isolation regions, and a dopant material being applied by ion implantation to selected surfaces not including the surface of an emitter region within a PNP transistor to be formed on the surface of the silicon wafer.
Figure 13:
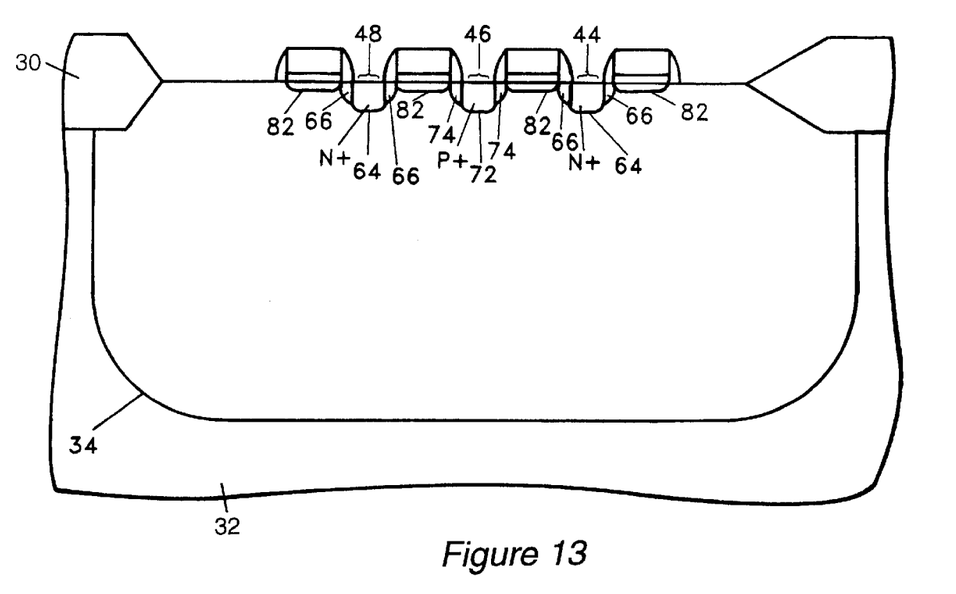
FIG. 13 is a cross sectional view of an example embodiment of an ESD protection circuit including a vertical PNP transistor fabricated in accordance with the principles of the invention and where the implantation step shown in FIG. 12 is used to introduce an N-type dopant to the surface of the silicon wafer beneath the patterned gate-electrode layer.

FIGS. 12 and 13 show an alternative embodiment of the present system in which the resistance of the channel area underneath the polysilicon isolations in the bipolar transistor is further reduced by application of an n-type dopant. For example, in FIG. 12, an n-type dopant 78 is applied to the surface of the n-well 34 in the wafer 32 for example by ion implantation. The n-type dopant 78 is applied to all surfaces except the area in which the emitter stripe will subsequently be formed, which is shown covered by a mask or shield 80. The implantation of FIG. 12 is advantageously performed during introduction of the n-type dopant in the PMOS Threshold Correction Implantation step that is a standard step in CMOS fabrication processes. Example dopants include phosphorous or arsenic having a dosage up to $10^{13}/cm^2$, using for example an energy level of 20–300 keV. Alternatively, a separate doping step may be used where the dosage provided in the PMOS Threshold Correction Implantation step is insufficient.

In the resulting bipolar transistor shown in FIG. 13, the fraction of the total base resistance determined by the extrinsic base is relatively low. This is because the extrinsic base resistance is determined by the parallel resistance of the n-well and the channel areas 82 underneath the polysilicon isolations. Thus the extrinsic base resistance is lowered through the introduction of the n-type dopant as shown in FIG. 12.

It will be evident to a person skilled in the art that the selected levels and areas of ion implantation in the various embodiments are implementation specific, and accordingly will vary dependent on the specific design parameters of the integrated circuit being fabricated.

While the invention has been described with reference to specific example embodiments, the description is not meant to be construed in a limiting sense. Various modifications of the disclosed embodiments, as well as other embodiments of the invention, will be apparent to persons skilled in the art upon reference to this description. As will be evident to one skilled in the art of semiconductor technology, while a PNP transistor was used as an example to describe the invention, the invention is equally applicable to vertical NPN transistors, by replacing n and nphu + regions with p and $p^+$ regions respectively, and vice versa. Further, the vertical bipolar transistors disclosed herein are suitable for use in any circuit in which high current events such as voltage spikes must handled, whatever their cause. It is therefore contemplated that the appended claims will cover any such modifications or embodiments which fall within the true scope of the invention.

What is claimed is:

1. A vertical bipolar transistor in an Electro-Static Discharge protection circuit, comprising:

an emitter stripe coupled with a signal source;

a base contact coupled with a clamp circuit; and a gate electrode between said emitter stripe and said base contact, said gate electrode coupled with said signal source; and sidewall spacers adjacent to sides of said gate electrode.

2. The vertical bipolar transistor of claim 1 wherein said bipolar transistor is a PNP transistor and further comprising a layer of n-type dopant in a selected surface of a silicon wafer, except beneath said emitter stripe.

3. The vertical bipolar transistor of claim 1 wherein said bipolar transistor is a NPN transistor and further comprising a layer of p-type dopant in a selected surface of a silicon wafer, except beneath said emitter stripe.

* * * * *